(12) United States Patent
Sarkar et al.

(10) Patent No.: US 12,355,411 B2
(45) Date of Patent: Jul. 8, 2025

(54) NONLINEARITY CANCELLATION CIRCUIT FOR ACTIVE FILTERS

(71) Applicant: TEXAS INSTRUMENTS INCORPORATED, Dallas, TX (US)

(72) Inventors: Subha Sarkar, Bangalore (IN); Rajat Agarwal, Bangalore (IN); Nagendra Krishnapura, Chennai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/498,520

(22) Filed: Oct. 31, 2023

(65) Prior Publication Data
US 2024/0283431 A1 Aug. 22, 2024

(30) Foreign Application Priority Data
Feb. 17, 2023 (IN) .............................. 202341010805

(51) Int. Cl.
H03H 11/04 (2006.01)
(52) U.S. Cl.
CPC .................................. H03H 11/04 (2013.01)
(58) Field of Classification Search
CPC .... H03H 19/004; H03H 19/002; H03H 11/04; H03H 11/12; H03H 11/126; H03H 11/1286
See application file for complete search history.

(56) References Cited

U.S. PATENT DOCUMENTS

| 4,849,707 | A | * | 7/1989 | Nicollini | H03F 3/005 330/69 |
| 5,973,536 | A | * | 10/1999 | Maejima | H03H 19/004 327/554 |
| 6,940,348 | B2 | * | 9/2005 | Confalonieri | H03F 3/45937 330/69 |
| 9,461,625 | B1 | * | 10/2016 | Prandi | H03H 19/004 |
| 2011/0279148 | A1 | * | 11/2011 | Watanabe | G11C 27/026 327/96 |

OTHER PUBLICATIONS

Subha Sarkar et al., "3.3 Bandpass Filter and Oscillator ICs with THD < -140dBc at 10Vppd for Testing High-Resolution ADCs" Published Feb. 20, 2023.

* cited by examiner

*Primary Examiner* — John W Poos
(74) *Attorney, Agent, or Firm* — Mandy Barsilai Fernandez; Frank D. Cimino

(57) ABSTRACT

A circuit (500) includes an active filter (108), including an input, a first output, and a second output. The circuit includes a first capacitor (502a) having a first terminal and a second terminal. The first terminal of the first capacitor is coupled to the first output of the active filter, and the second terminal of the first capacitor is coupled to the input of the active filter. The first capacitor has a capacitance value. The circuit includes a capacitor bank (504a) having a first terminal and a second terminal. The first terminal of the capacitor bank is coupled to the second output of the active filter. The second terminal of the capacitor bank is coupled to the second terminal of the first capacitor and coupled to the input of the active filter. The capacitor bank has a capacitance that is equivalent to the capacitance value.

18 Claims, 12 Drawing Sheets

NONLINEARITY CANCELLATION CIRCUIT FOR ACTIVE FILTERS

CROSS-REFERENCE TO RELATED APPLICATION

This Application claims the benefit of India Provisional Application number 202341010805, filed on Feb. 17, 2023, the contents of which are hereby incorporated by reference in their entirety.

BACKGROUND

Some circuits include active filters with amplifier circuitry and filter circuitry. Some applications can benefit from low total harmonic distortion (THD) signals at the output of active filters. The arrangement of components within the active filter can have an effect on the amount of THD introduced to a signal at the output of the active filter.

SUMMARY

A circuit includes an active filter, including an input, a first output, and a second output. The circuit includes a first capacitor having a first terminal and a second terminal, where the first terminal of the first capacitor is coupled to the first output of the active filter, the second terminal of the first capacitor is coupled to the input of the active filter, and where the first capacitor has a capacitance value. The circuit includes a capacitor bank having a first terminal and a second terminal, where the first terminal of the capacitor bank is coupled to the second output of the active filter. The second terminal of the capacitor bank is coupled to the second terminal of the first capacitor and coupled to the input of the active filter. The capacitor bank has a capacitance that is equivalent to the capacitance value.

A circuit includes a first amplifier having a first input, a first output, and a second output. The circuit includes a first capacitor having a first terminal and a second terminal, the first terminal of the first capacitor is coupled to the first input of the first amplifier and the second terminal of the first capacitor is coupled to the first output of the first amplifier. The circuit includes a capacitor bank having a first terminal and a second terminal, where the first terminal of the capacitor bank is coupled to the second output of the first amplifier, and the second terminal of the capacitor bank is coupled to the first input of the first amplifier and the first terminal of the first capacitor. The circuit includes a second capacitor having a first terminal and a second terminal, where the first terminal of the second capacitor is coupled to the first output of the first amplifier. The second terminal of the second capacitor is coupled to the second terminal of the capacitor bank, the first terminal of the first capacitor, and the first input of the first amplifier.

An integrated circuit including a first amplifier having a first input, a second input, a first output, and a second output. The integrated circuit includes a first capacitor having a first terminal and a second terminal, where the first terminal of the first capacitor is coupled to the first input of the first amplifier and the second terminal of the first capacitor is coupled to the first output of the first amplifier. The integrated circuit includes a second capacitor having a first terminal and a second terminal, where the first terminal of the second capacitor is coupled to the second input of the first amplifier, and the second terminal of the second capacitor is coupled to the second output of the first amplifier The integrated circuit includes a first capacitor bank having a first terminal and a second terminal, where the first terminal of the first capacitor bank is coupled to the second output of the first amplifier and the second terminal of the first capacitor bank is coupled to the first terminal of the first capacitor. The integrated circuit includes a second capacitor bank having a first terminal and a second terminal, where the first terminal of the second capacitor bank is coupled to the first output of the first amplifier and the second terminal of the second capacitor bank is coupled to the first terminal of the second capacitor. The integrated circuit includes a third capacitor having a first terminal and a second terminal, where the first terminal of the third capacitor is coupled to the first output of the first amplifier, and where the second terminal of the third capacitor is coupled to the second terminal of the first capacitor bank and the first terminal of the first capacitor. The integrated circuit includes a fourth capacitor having a first terminal and a second terminal, where the first terminal of the fourth capacitor is coupled to the second output of the first amplifier, and where the second terminal of the fourth capacitor is coupled to the second terminal of the second capacitor bank and the first terminal of the second capacitor.

BRIEF DESCRIPTION OF THE DRAWINGS

The same reference numbers or other reference designators are used in the drawings to designate the same or similar (either by function and/or structure) features.

DETAILED DESCRIPTION

The present description is described with reference to the attached figures. The figures are not drawn to scale and they are provided merely to illustrate the description. Several aspects of the description are described below with reference to example applications for illustration. Numerous specific details, relationships, and methods are set forth to provide an understanding of the description. Furthermore, not all illustrations, components, features, or arrangements are required to implement a methodology in the selected present description.

Some analog circuit devices or applications benefit from low total harmonic distortion (THD) from a sinusoidal signal. For example, testing of high precision circuits for linearity can utilize low THD sinusoidal sources on the order of −140 dB THD or better. High resolution analog to digital converters (ADCs) and associated testing hardware can utilize low THD. In some instances, oscillators, filters, and active filters are used to generate low distortion signals. Filters for such applications can be designed such that harmonics are suppressed from an input signal without affecting the fundamental frequency ($F_0$) of the sinusoidal signal. However, passive components in filters, such as capacitors, can introduce third harmonic distortion (HD3) to the sinusoidal signal. Aspects of this description relate to lowering or diminishing distortion caused by passive components in a filter or active filter by use of a cancellation circuit.

Figure 1:
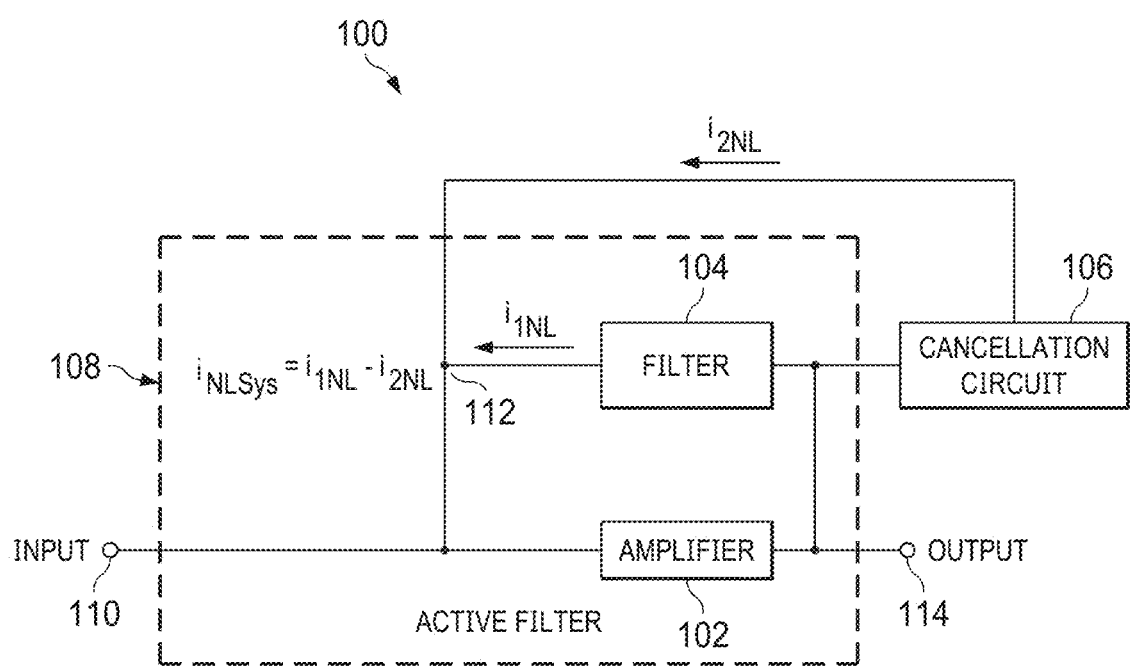
FIG. 1 is an example circuit that includes an active filter and a cancellation circuit.
Figure 2:
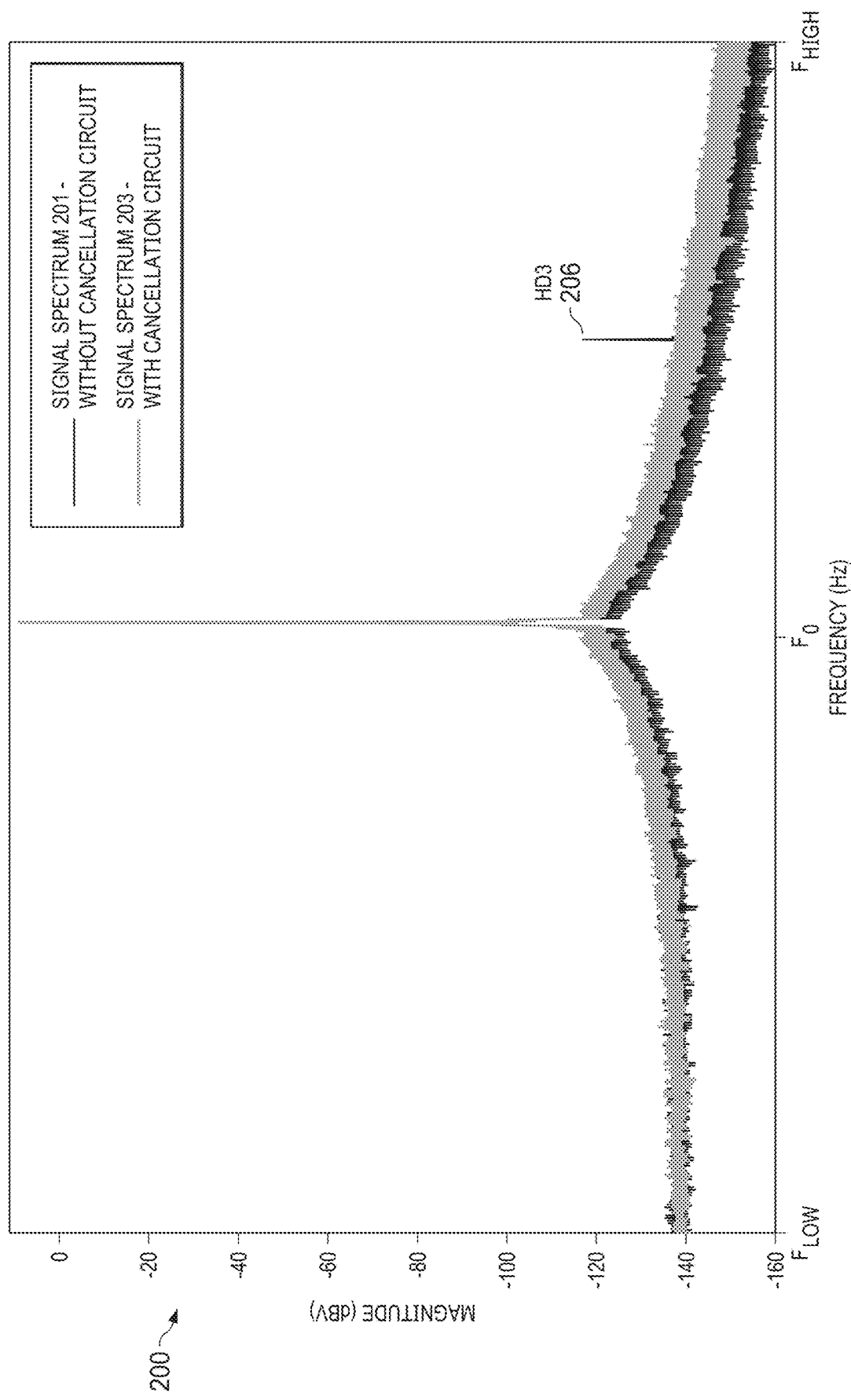
FIG. 2 shows an example graph that illustrates example frequency responses of the active filter of FIG. 1.

FIG. 1 shows a circuit 100 that includes an active filter 108 and a cancellation circuit 106. FIG. 2 shows a graph 200 that shows a frequency response of the active filter with and without the cancellation circuit. FIGS. 1 and 2 illustrate the distortion that can be generated by passive components of a filter and shows that the distortion can be eliminated by a cancellation circuit. FIGS. 1 and 2 are now referred to concurrently.

FIG. 1 shows an active filter 108 that includes a (first) amplifier 102 and a filter 104. The active filter 108 has an input 110 and an output 114. The amplifier 102 has a first terminal and a second terminal. The first terminal of the amplifier 102 is coupled to the input 110 of the active filter 108 and the second terminal of the amplifier 102 is coupled to the output 114 of the active filter 108. The filter 104 has a first terminal and a second terminal. The first terminal of the filter 104 is coupled to the first terminal of the amplifier 102 and the input 110 of the active filter 108. The second terminal of the filter 104 is coupled to the second terminal of the amplifier 102 and the output 114 of the active filter 108. Passive components of the filter 104 can generate distortions that manifest as a (first) non-linear current $i_{1NL}$ at a node 112 arranged at a connection between the second terminal of the filter 104 and the first terminal of the amplifier 102.

For example, a capacitor of the filter 104 can generate HD3 due to non-linearities associated with material properties of the capacitor. In some aspects, the capacitor is formed with a dielectric material that has a non-linear response to an applied electric field. Accordingly, the polarization of the dielectric is not directly proportional to an applied voltage resulting in a non-linear current. Also, a capacitor may be formed with a ferroelectric material that has a non-linear relationship between an electric field (E) applied to the ferroelectric material and the polarization (P) of the electric dipole moment of the ferroelectric material. Thus, the P-E relationship for the ferroelectric material is hysteretic resulting in the non-linear current from the capacitor in the presence of a varied applied voltage. Other sources of non-linearities in capacitors can include parasitic effects and electrostriction that exhibit non-linear properties resulting in $i_{1NL}$ at node 112.

FIG. 2 shows signal spectrums at the output 114 of the active filter 108 when an input sinusoid is applied at the input 110 of the active filter 108. In some examples, the input sinusoid is without distortion or with a negligible amount of distortion for the application. Graph 200 shows the magnitude of the signal spectrum on the vertical axis and the frequency of the signal spectrum on the horizontal axis from a low frequency ($F_{Low}$) to a high frequency ($F_{High}$). The response of the active filter 108 without the presence of the cancellation circuit 106 of FIG. 1 is shown in signal spectrum 201. As seen in the signal spectrum 201, there is a peak at the fundamental frequency ($F_0$) that corresponds to the frequency of the input sinusoid. There is also a third harmonic peak between $F_0$ and $F_{High}$, represented by HD3 206, which is generated by one or more passive components (e.g., capacitor(s)) of the filter 104 according to the mechanisms described above.

Some applications benefit from reducing the HD3 206 caused by distortion of filter 104 where low THD is desired.

In some aspects, the HD3 206 can be improved by various techniques. For example, capacitors with advanced materials and manufacturing processes can be implemented, but such a solution can be expensive or utilize excessive space on chip. Other solutions to reduce HD3 206 can include reducing the amplitude of the input sinusoid, and later amplifying the amplitude after filtering, but such a solution can utilize excessive space on chip and degrade the signal to noise ratio of the signal spectrum 201.

As described further herein, the cancellation circuit 106 can be coupled to the active filter 108 to reduce or eliminate the HD3 206 caused by the filter 104. As shown in FIG. 1, the cancellation circuit 106 has a first terminal and a second terminal. The first terminal of the cancellation circuit 106 is coupled to the second terminal of the filter 104 and the second terminal of the amplifier 102. The second terminal of the cancellation circuit 106 is coupled to the first terminal of the filter 104 at node 112. In an example, the cancellation circuit 106 uses capacitors of the same technology or type as those in the filter 104 (which generate HD3 206). Using capacitors of the same technology or type in the cancellation circuit 106 as those used in the filter 104 enables the cancellation circuit 106 to generate the same type of non-linear current as the filter 104. In an example, capacitors in the cancellation circuit 106 generate a (second) non-linear current $i_{2NL}$. $i_{2NL}$ is generated with the same or substantially the same, amplitude and opposite phase relative to $i_{1NL}$. As such, the system non-linear current $i_{NLSys}$ for circuit 100 is represented by equation (1) below:

$$i_{NLSys} = i_{1NL} - i_{2NL} = 0, \qquad (1)$$

As seen in equation (1), the $i_{NLSys}$ is zero and, $i_{1NL}$ generated by the filter 104 is canceled by $i_{2NL}$ of the cancellation circuit 106. As a result, the HD3 206 of FIG. 2 is canceled or reduced as seen in signal spectrum 203, which shows the response of the active filter 108 with the cancellation circuit 106. Examples herein describe mechanisms of the cancellation circuit 106 that reduce or eliminate distortions generated by the filter 104 thereby providing active filtering solutions with low THD (e.g., approximately −140 dB).

Figure 3:
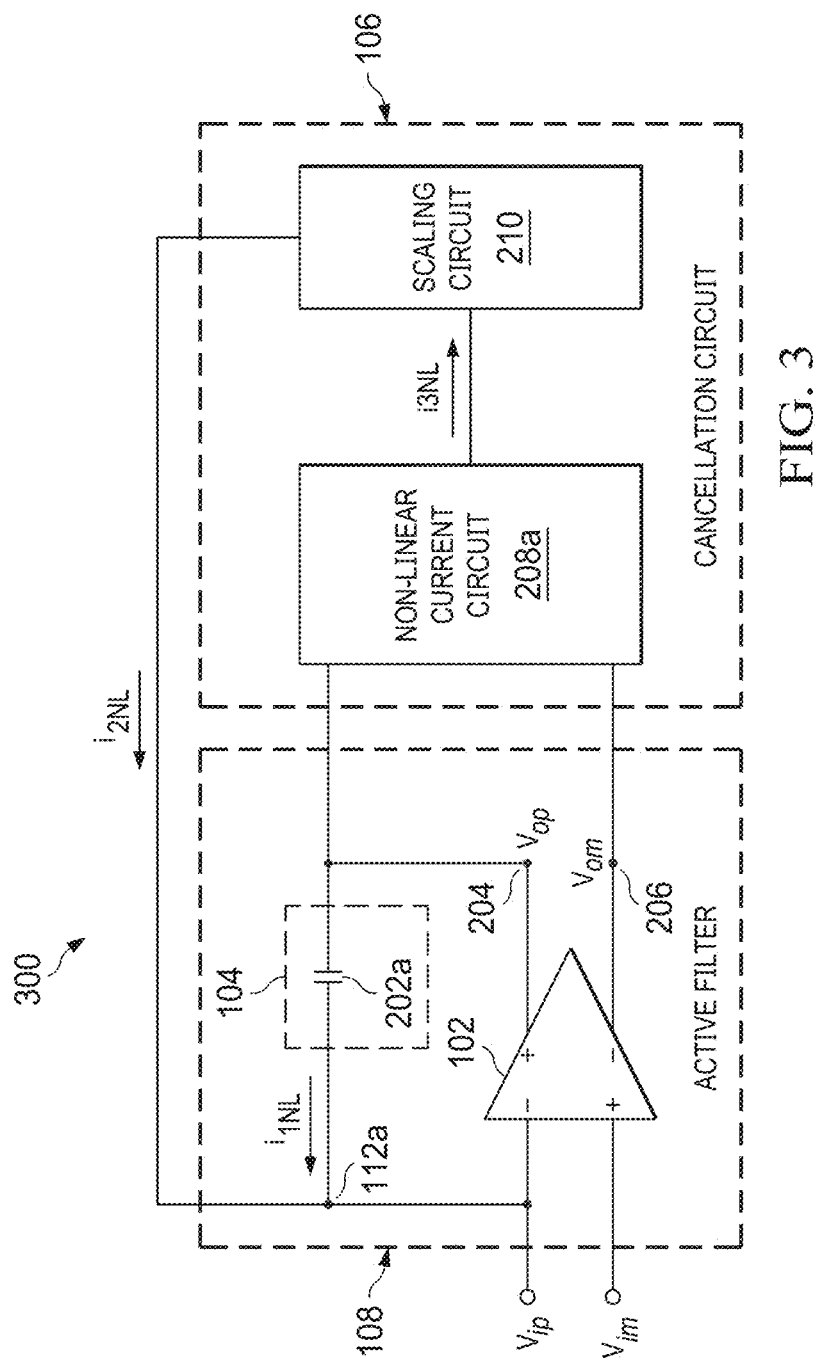
FIGS. 3, 4, and 5 are example circuits that illustrate example aspects of the active filter and the cancellation circuit.

FIG. 3 shows a circuit 300 illustrating example aspects of the active filter and cancellation circuit of FIG. 1. FIG. 3 shows the amplifier 102 as a differential device and associated coupling to the filter 104 and cancellation circuit 106.

Circuit 300 shows the active filter 108 with the amplifier 102 and filter 104. The amplifier 102 has a first input, a second input, a first output, and a second output. The first input of the amplifier 102 is the inverting input of the amplifier 102 and is coupled to $V_{ip}$. The second input of the amplifier 102 is the non-inverting input of the amplifier 102 and coupled to $V_{im}$. In an example $V_{ip}$ and $V_{im}$ represent terminals of a differential signal source. The first output of the amplifier 102 is the non-inverting output of the amplifier 102. The first output of the amplifier 102 is coupled to node $V_{op}$ 204. The second output of the amplifier 102 is the inverting output of the amplifier 102. The second output of the amplifier 102 is coupled to node $V_{om}$ 206.

The filter 104 is shown including a (first) capacitor 202a. Capacitor 202a has a first terminal and a second terminal. The first terminal of capacitor 202a is coupled to the first input of the amplifier 102 through a node 112a. Node 112a of FIG. 3 corresponds to node 112 of FIG. 1. The second terminal of capacitor 202a is coupled to the first output of the amplifier 102 at node $V_{op}$ 204.

The cancellation circuit 106 is coupled to the first output and the second output of the amplifier 102. The cancellation circuit 106 includes a (first) non-linear current circuit 208a. The non-linear current circuit 208a has a first input, a second input, and an output. The first input of the non-linear current circuit 208a is coupled to the second terminal of the capacitor 202a and the first output of the amplifier 102. The second input of the non-linear current circuit 208a is coupled to the second output of the amplifier 102.

The cancellation circuit 106 further includes a scaling circuit 210. The scaling circuit 210 has a first input and a first output. The first input of the scaling circuit 210 is coupled to the output of the non-linear current circuit 208a. The first output of the scaling circuit 210 is coupled to the first terminal of the capacitor 202a and the first input of the amplifier 102 at the node 112a.

In this example, the capacitor 202a is arranged in parallel with the amplifier 102 between the nodes 112a and 204 and is suitable for low-pass filter and bandpass filter applications. The filter 104 injects the non-linear current $i_{1NL}$ towards the first input of the amplifier 102 in response to an output voltage of the amplifier 102 at node $V_{op}$ 204. In an example, the cancellation circuit 106 outputs a second current $i_{2NL}$ that has an equal amplitude and an opposite phase relative to $i_{1NL}$. As described in FIGS. 1 and 2, the $i_{2NL}$ from the cancellation circuit 106 cancels $i_{1NL}$ from the filter 104 at node 112a (or at the first input of the amplifier 102).

The non-linear current circuit 208a generates a (third) non-linear current $i_{3NL}$ at the output of the non-linear current circuit 208a. The $i_{3NL}$ is generated with a phase that is opposite of a phase of the $i_{1NL}$. In some examples, an amplitude of $i_{3NL}$ is different than an amplitude of $i_{1NL}$. In these examples the scaling circuit 210 adjusts the amplitude of $i_{3NL}$ to match $i_{1NL}$ resulting in $i_{2NL}$. In some examples, the scaling circuit 210 generates $i_{2NL}$ from $i_{3NL}$. The scaling circuit 210 can scale $i_{3NL}$ to an amplitude that matches an amplitude of $i_{1NL}$ to generate $i_{2NL}$.

Figure 4:
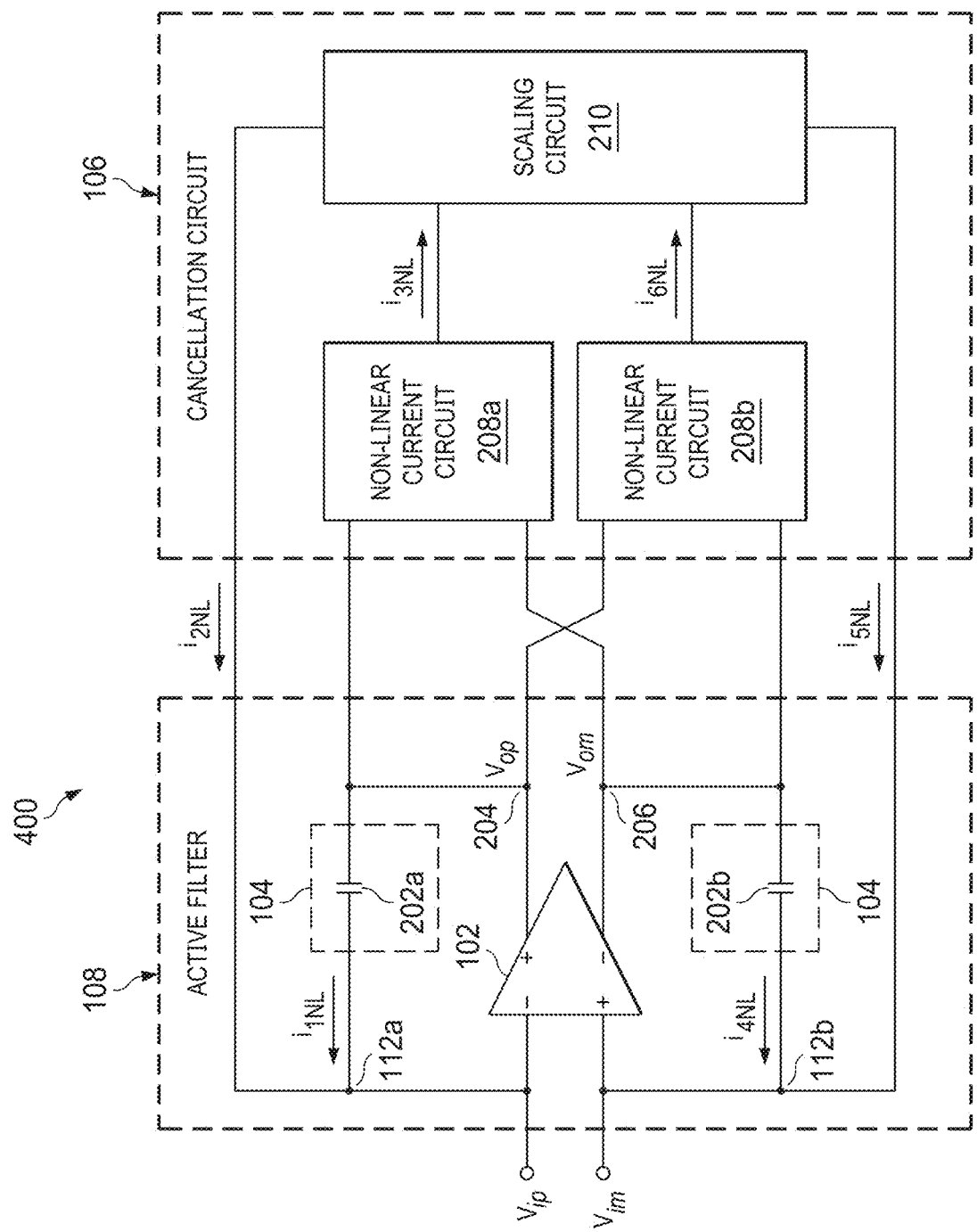

FIG. 4 shows a circuit 400 illustrating example aspects of the active filter 108 and cancellation circuit 106 of FIG. 3. FIG. 4 shows additional examples of the filter 104, scaling circuit 210 and a (second) non-linear current circuit 208b.

Circuit 400 shows the filter 104 further including a (second) capacitor 202b. The capacitor 202b has a first terminal and a second terminal. The first terminal of the capacitor 202b is coupled to the second input of the amplifier 102 through a node 112b. The second terminal of capacitor 202b is coupled to the second output of the amplifier 102 at node $V_{om}$ 206.

The cancellation circuit 106 further includes the non-linear current circuit 208b. The non-linear current circuit 208b has a first input, a second input, and an output. The first input of the non-linear current circuit 208b is coupled to the first output of the amplifier 102 at node $V_{op}$ 204. The second input of the non-linear current circuit 208b is coupled to the second terminal of capacitor 202b and the second output of the amplifier 102.

The scaling circuit 210 has the first input, a second input, the first output, and a second output. The first input and the first output of the scaling circuit 210 are coupled to the output of the non-linear current circuit 208a and the first terminal of the capacitor 202a respectively, as described in FIG. 3. The second input of the scaling circuit 210 is coupled to the output of the non-linear current circuit 208b. The second output of the scaling circuit 210 is coupled to the first terminal of the capacitor 202b and the second input of the amplifier 102 at the node 112b.

The capacitor 202b of the filter 104 is injects a (fourth) non-linear current $i_{4NL}$ towards the second input of the amplifier 102 responsive to an output voltage of the amplifier 102 at node $V_{om}$ 206. The cancellation circuit 106 is outputs a (fifth) non-linear current $i_{5NL}$ that has an equal amplitude and an opposite phase relative to $i_{4NL}$. As such, the $i_{5NL}$ from the cancellation circuit 106 cancels the $i_{4NL}$ of the filter 104 at node 112b (or at the second input of the amplifier 102).

The non-linear current circuit 208b is generates a (sixth) non-linear current $i_{6NL}$ at the output of the non-linear current circuit 208b. The $i_{6NL}$ is generated with a phase that is opposite of a phase of the $i_{4NL}$. In some examples, an amplitude of $i_{6NL}$ is different than an amplitude of $i_{4NL}$. In these examples the scaling circuit 210 adjusts the amplitude of $i_{6NL}$ to match $i_{4NL}$ resulting in $i_{5NL}$. In some examples, the scaling circuit 210 generates $i_{5NL}$ from $i_{6NL}$. The scaling circuit 210 can scale $i_{6NL}$ to an amplitude that matches an amplitude of $i_{4NL}$ to generate $i_{5NL}$.

Figure 5:
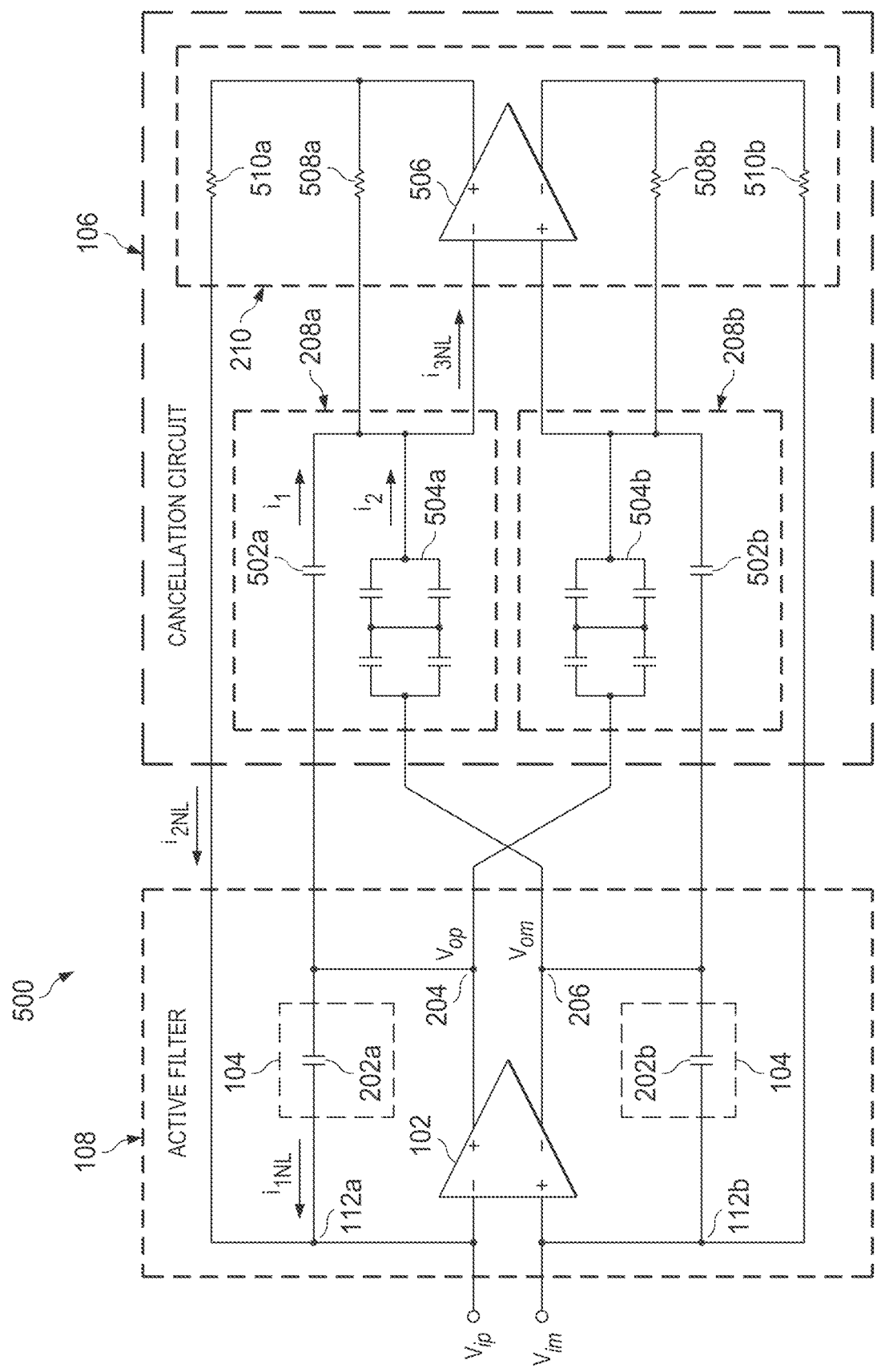

FIG. 5 shows a circuit 500 illustrating example aspects of the active filter and cancellation circuit of FIG. 4. FIG. 5 shows additional examples of the non-linear current circuit 208a, the non-linear current circuit 208b, and the scaling circuit 210.

Circuit 500 shows the non-linear current circuit 208a with a (fourth) capacitor 502a and a (first) capacitor bank 504a. The capacitor 502a has a first terminal and a second terminal. The first terminal is coupled to the first input of the non-linear current circuit 208a. As such, the first terminal of the capacitor 502a is coupled to the second terminal of the capacitor 202a and the first output of the amplifier 102.

The capacitor bank 504a has a first terminal and second terminal. The capacitor bank 504a is shown as a bank (or array or circuit) of four capacitors, but can have different configurations as described further in FIGS. 6-8. The first terminal of the capacitor bank 504a is coupled to the second input of the non-linear current circuit 208a. As such, the first terminal of the capacitor bank 504a is coupled to the second output of the amplifier 102 at node $V_{om}$ 206. The second terminal of the capacitor bank 504a is coupled to the second terminal of the capacitor 502a.

The non-linear current circuit 208b has a (fifth) capacitor 502b and a (second) capacitor bank 504b. The capacitor bank 504b has a first terminal and second terminal. The capacitor bank 504b is shown as a bank of four capacitors, but can have different configurations as described further in FIGS. 6-8. The first terminal of the capacitor bank 504b is coupled to the first input of the non-linear current circuit 208b. As such, the first terminal of the capacitor bank 504b is coupled to the first output of the amplifier 102 at node $V_{op}$ 204.

The capacitor 502b has a first terminal and a second terminal. The first terminal is coupled to the second input of the non-linear current circuit 208b. As such, the first terminal of the capacitor 502b is coupled to the second terminal of the capacitor 202b and the second output of the amplifier 102. The second terminal of the capacitor 502b is coupled to the second terminal of the capacitor bank 504b.

The scaling circuit 210 has a (second) amplifier 506 with a first input, a second input, a first output, and a second output. The first input of the amplifier 506 is an inverting input. The second input of the amplifier 506 is a non-inverting input. The first output of the amplifier 506 is a non-inverting output. The second output of the amplifier 506 is an inverting output. The first input of the amplifier 506 is coupled to the second terminal of the capacitor bank 504a and the second terminal of the capacitor 502a. The second input of the amplifier 506 is coupled to the second terminal of the capacitor bank 504b and the second terminal of the capacitor 502b.

The scaling circuit further includes a (first) resistor 508a, a (second) resistor 508b, a (third) resistor 510a, and a (fourth) resistor 510b. The resistor 508a has a first terminal and a second terminal. The first terminal of resistor 508a is coupled to the second terminal of capacitor 502a, the second terminal of capacitor bank 504a, and the first input of amplifier 506. The second terminal of resistor 508a is coupled to the first output of amplifier 506. The resistor 508b has a first terminal and a second terminal. The first terminal of resistor 508b is coupled to the second terminal of capacitor 502b, the second terminal of capacitor bank 504b, and the second input of amplifier 506. The second terminal of resistor 508b is coupled to the second output of amplifier 506.

The resistor 510a has a first terminal and a second terminal. The first terminal of resistor 510a is coupled to the first terminal of capacitor 202a and the first input of amplifier 102 at node 112a. The second terminal of resistor 510a is coupled to the first output of amplifier 506 and the second terminal of resistor 508a. The resistor 510b has a first terminal and a second terminal. The first terminal of resistor 510b is coupled to the first terminal of capacitor 202b and the second input of amplifier 102 at node 112b. The second terminal of resistor 510b is coupled to the second output of amplifier 506 and the second terminal of resistor 508b.

Circuit 500 illustrates further configuration details of the non-linear current circuits 208a, 208b. As described previously, the non-linear current circuits 208a, 208b generate a current (e.g., $i_{3NL}$, $i_{6NL}$ of FIG. 4) that is opposite in phase relative to non-linear current generated by the filter 104 (e.g., $i_{1NL}$ of FIGS. 1, 3, and 4 and $i_{4NL}$ of FIG. 4). Capacitor 502a generates a current $i_1$ at the second terminal of capacitor 502a responsive to the voltage at node $V_{op}$ 204. $i_1$ includes both a linear current component and a non-linear current component where the non-linear current component is generated according to the mechanisms related to the capacitor material properties described previously. The capacitor bank 504a generates a current $i_2$ at the second terminal of capacitor bank 504a responsive to the voltage at node $V_{om}$ 206. The current $i_2$ includes both a linear current component and a non-linear current component. The capacitor 502a and the capacitors of the capacitor bank 504a are of the same type or technology as capacitors 202a, 202b of filter 104. As such, the distortion caused by capacitor 502 and capacitor bank 504a are similar to the distortion caused by capacitors 202a, 202b.

Figure 6:
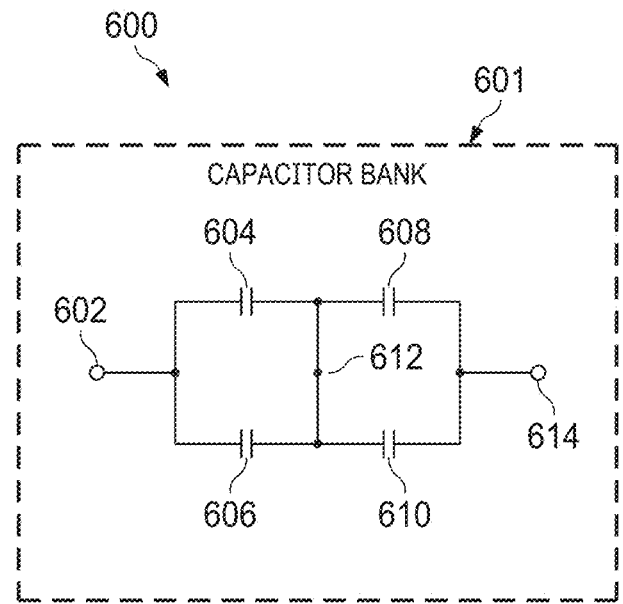
FIGS. 6, 7A, 7B, and 8 are example circuits that illustrate example capacitor banks of the cancellation circuit.

As described further in FIGS. 6-7, the capacitance of capacitor 502a and the equivalent capacitance of capacitor bank 504a can be the same capacitance values. Thus the linear component of $i_1$ and $i_2$ have the same magnitude. Since capacitor 502a is coupled to the non-inverting output (positive output) of amplifier 102 and the capacitor bank 504a is coupled to the inverting output (negative output) of amplifier 102, the phase of $i_1$ and $i_2$ are opposite or 180 degrees out of phase with respect to one another. Since the linear component of $i_1$ and the linear component of $i_2$ are of the same amplitude and opposite phase, the linear components of the currents cancel where the second terminal of the capacitor bank 504a couples to the second terminal of the capacitor 502a. However, the non-linear components of $i_1$ and $i_2$ are different from one another and do not cancel. As such, $i_{3NL}$ at the output of the non-linear current circuit 208a is responsive to the sum of the non-linear components of $i_1$ and $i_2$ which is dominated by the non-linear current component of $i_2$.

Since capacitor 202a is coupled to the non-inverting output of amplifier 102 and capacitor bank 504a is coupled to the inverting output of amplifier 102, $i_2$ has an opposite phase relative to $i_{1NL}$ from capacitor 202a. However, as described previously, while $i_{3NL}$ has an opposite phase relative to $i_{1NL}$, $i_{3NL}$ may have a different amplitude relative to $i_{1NL}$. As such, $i_{3NL}$ can be scaled by the scaling circuit 210 to have an amplitude that is equal to the amplitude of $i_{1NL}$. The analysis and description with regards to capacitor 502a and capacitor bank 504a applies also to capacitor 502b and capacitor bank 504b.

The resistors 508a, 508b, 510a, 510b are set a current gain at the first and second outputs of the amplifier 506. As such, the values of resistors 508a, 510a can be selected to scale the current $i_{3NL}$ to the same amplitude of current $i_{1NL}$, thereby generating $i_{2NL}$ at the first output of the amplifier 102 that cancels $i_{1NL}$. Resistor 508b and 510b generate a scaled current at the second output of the amplifier 506 (e.g., 15NL of FIG. 4).

FIG. 6 shows a circuit 600 illustrating example aspects of the capacitor bank. FIG. 6 shows additional examples of the capacitor banks 504a, 504b of FIG. 5.

Circuit 600 shows a capacitor bank 601 with a (first) capacitor 604, a (second) capacitor 606, a (third) capacitor 608, and a (fourth) capacitor 610. The capacitor bank 601 can be the capacitor bank 504a or the capacitor bank 504b of, for example, FIG. 5. The capacitor bank 601 has a (first) terminal 602 and a (second) terminal 614. The first terminal 602 of the capacitor bank 601 is coupled to either the first output or the second output of the amplifier 102. Capacitor 604 has a first terminal and a second terminal. The first terminal of capacitor 604 is coupled to the first terminal 602 of the capacitor bank 601. The second terminal of the capacitor 604 is coupled to a node 612 of the capacitor bank 601.

Capacitor 606 has a first terminal and a second terminal. The first terminal of capacitor 606 is coupled to the first terminal 602 of the capacitor bank 601. The second terminal of capacitor 606 is coupled to the second terminal of capacitor 604 at node 612 of the capacitor bank 601. Capacitor 608 has a first terminal and a second terminal. The first terminal of capacitor 608 is coupled to the second terminal of capacitor 604 and the second terminal of capacitor 606 at node 612. The second terminal of capacitor 608 is coupled to the second terminal 614 of capacitor bank 601. Capacitor 610 has a first terminal and a second terminal. The first terminal of capacitor 610 is coupled to the second terminal of capacitors 604, 606 and the first terminal of capacitor 608 at node 612. The second terminal of capacitor 610 is coupled to the output of the capacitor bank 601.

As described previously, the equivalent capacitance of the capacitor bank 601 (e.g., capacitor banks 504a, 504b of FIG. 5) is the same as the capacitance of capacitor 502a or capacitor 502b of FIG. 5. As such, if the capacitance value of capacitor 502a is C then the capacitance value of each of capacitors 604, 606, 608, 610 is also C, and the equivalent capacitance of capacitor bank 601 is C. By configuring capacitor bank 601 with the same equivalent capacitance as capacitor 502a or capacitor 502b of FIG. 5, the capacitor bank 601 generates a linear current that is the same magnitude and opposite phase relative to a linear current generated by capacitor 502a or capacitor 502b. As such, the linear current at the second terminal of capacitor bank 601 cancels the linear current generated by capacitor 502a or capacitor 502b. As such, capacitor 604 is in parallel with capacitor 606 between terminal 602 and node 612. Capacitor 608 and capacitor 610 are in parallel between nodes 612 and terminal 614. Capacitors 604 and 608 are in series between terminals 602 and 614. Capacitors 606 and 610 are in series between terminals 602 and 614. Due to the series/parallel combination of capacitors 604, 606, 608, 610, the non-linear current generated by capacitor bank 601 is different than the non-linear current generated by capacitor 502a or capacitor 502b. As such, the non-linear current generated by capacitor bank 601 is of a different amplitude relative to the non-linear current generated by capacitor 502a or capacitor 502b. Thus the non-linear currents from the capacitor bank 601 and capacitor 502a or capacitor 502b do not cancel. The resulting non-linear current can be scaled by the scaling circuit 210 of FIG. 5 to cancel the non-linear current generated by the filter 104 of FIG. 5.

In other examples, the capacitance of capacitors 502a, 502b of FIG. 5 and capacitors 604, 606, 608, 610 are responsive to a capacitance of the filter 104. For example, the capacitance value of capacitors 202a, 202b can each be C. The capacitance value of capacitors 502a, 502b can be C/4. The capacitance value of each of capacitors 604, 606, 608, 610 can be C/4. As such, the equivalent capacitance of the capacitor bank 601 is C/4, which is the same as the capacitance value of capacitors 502a, 502b. Therefore, the capacitance value of capacitors in the non-linear current circuits 208a, 208b of FIG. 5 can be selected design values that balance the size and expense of capacitors with the available space on the chip to implement the non-linear current circuits 208a and 208b.

Referring also to FIG. 5, in another example, capacitor 202a has a capacitance value (C), the capacitor 202b has a capacitance that is C, and the capacitor 502a has a capacitance value that is C multiplied by a scalar b, (i.e., bC). The capacitor 502b has a capacitance value that is bC, and the capacitor bank 504a and the second capacitor bank 504b each have an equivalent capacitance that is bC. Accordingly, the capacitor bank 504a and capacitor bank 504b can each have two or more capacitors where an equivalent capacitance of the capacitor banks 504a, 504b is the same as a capacitance value of capacitors 502a, 502b. As such, the capacitor bank 601 can comprise a plurality of capacitors where a capacitance value of each of the plurality of capacitors is the same as a capacitance value of the capacitors 502a, 502b.

Figure 7A:
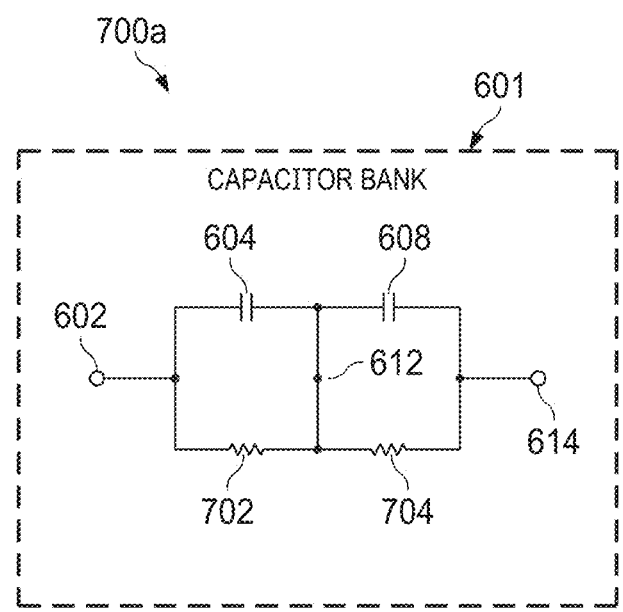

FIG. 7A shows a circuit 700a illustrating example aspects of the capacitor bank. FIG. 7A shows additional examples of the capacitor banks 504a, 504b of FIG. 5.

Circuit 700a shows alternative features relative to FIG. 6 where capacitors 606, 610 of FIG. 6 are replaced with a (first) resistor 702 and a (second) resistor 704. Accordingly, resistor 702 has a first terminal and a second terminal. The first terminal of resistor 702 is coupled to the first terminal 602 of the capacitor bank 601. The second terminal of resistor 702 is coupled to the second terminal of capacitor 604 and the first terminal of capacitor 608 at node 612. Resistor 704 has a first terminal and a second terminal. The first terminal of resistor 704 is coupled to the second terminal of resistor 702, the second terminal of capacitor 604, and the first terminal of capacitor 608 at node 612. The second terminal of resistor 704 is coupled to the second terminal 614 of capacitor bank 601.

In this example, the capacitor bank 601 has two capacitors (i.e., capacitors 604, 608) and two resistors (i.e., resistor 702, 704). In some aspects, circuit 700a can reduce space on a chip relative to circuit 600. As there are two capacitors, the capacitor values of circuit 700a are different relative to circuit 600. In circuit 700a, each of capacitors 604, 608 have a capacitance value that is twice that of a capacitance value of capacitors 502a, 502b. For example, if the capacitance value of capacitors 502a, 502b is C/4, then the capacitance value of capacitors 604, 608 are C/2. As such, the equivalent capacitance of the capacitor bank 601 (i.e., C/4 as the capacitors are in series between terminals 602 and 614) is the same as the capacitance value of capacitors 502a, 502b. Resistors 702, 704 load the output of amplifier 102 and/or are arranged to define node 612 such that node 612 of capacitor bank 601 is not floating. For example, resistors 702, 704 can be load resistors that stabilize the output of amplifier 102. Furthermore, resistors 702, 704 can generate a linear current from the capacitor bank 601 that can cancel linear current from other resistors in the circuit (e.g., resistors 1204a, 1204b described in FIG. 12).

Figure 7B:
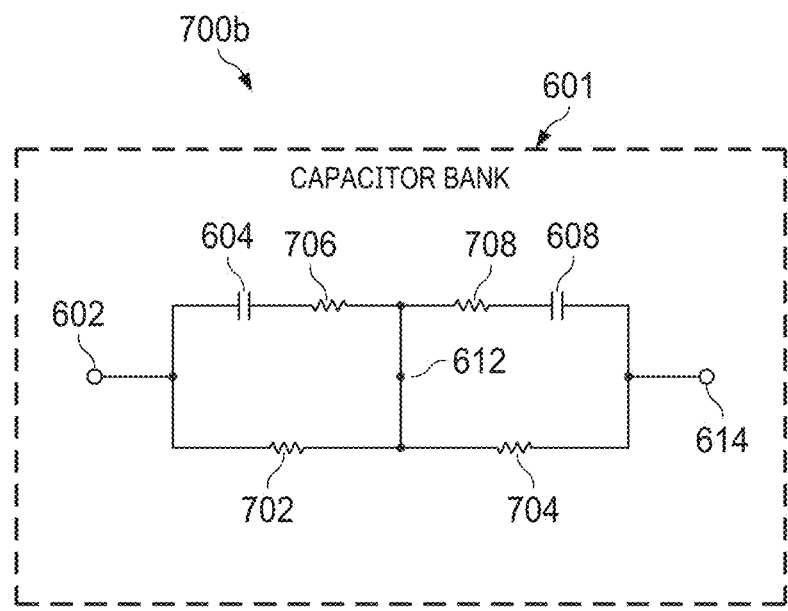

FIG. 7B shows a circuit 700b illustrating example aspects of the capacitor bank. FIG. 7B shows additional examples of the capacitor banks 504a, 504b of FIG. 5.

Circuit 700b shows alternative features relative to FIG. 7A where resistors 706 and 708 are in series with capacitors 604, 608 between terminals 602 and 614. Resistor 706 has a first terminal and a second terminal. The first terminal of resistor 706 is coupled to the second terminal of capacitor 604. The second terminal of resistor 706 is coupled to node 612. Resistor 708 has a first terminal and a second terminal. The first terminal of resistor 708 is coupled to node 612. The second terminal of resistor 708 is coupled to the first terminal of capacitor 608. Resistors 706, 708 can load the output of amplifier 102 for stability.

Figure 8:
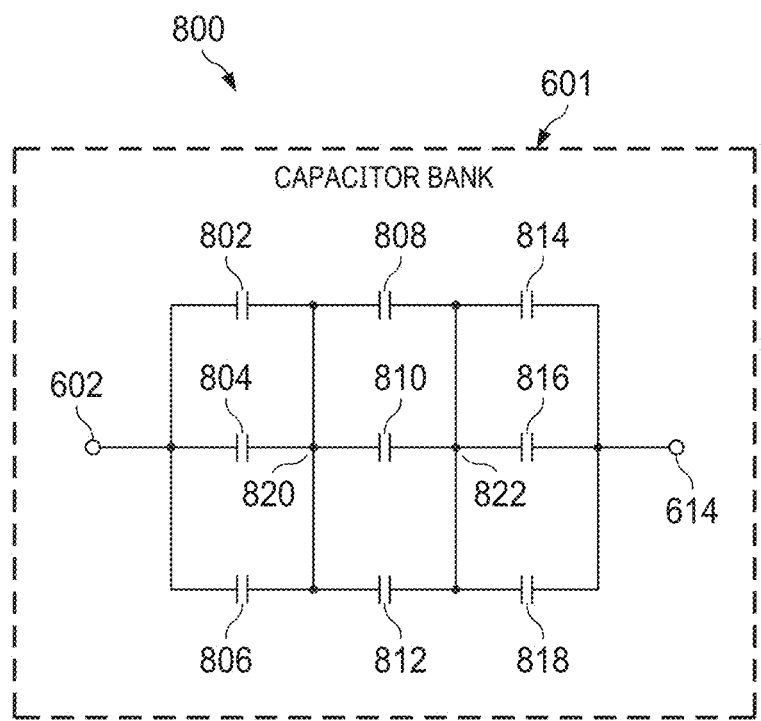

FIG. 8 shows a circuit 800 illustrating example aspects of the capacitor bank. FIG. 8 shows additional examples of the capacitor banks 504a, 504b of FIG. 5.

Circuit 800 shows a (first) capacitor 802, a (second) capacitor 804, a (third) capacitor 806, a (fourth) capacitor 808, a (fifth) capacitor 810, a (sixth) capacitor 812, a (seventh) capacitor 814, a (eighth) capacitor 816, and a (ninths) capacitor 818. Capacitor 802 has a first terminal and a second terminal. The first terminal of capacitor 802 is coupled to the first terminal 602 of capacitor bank 601. The second terminal of capacitor 802 is coupled to a (first) node 820. Capacitor 804 has a first terminal and a second terminal. The first terminal of capacitor 804 is coupled to the first terminal 602 of the capacitor bank 601. The second terminal of capacitor 804 is coupled to node 820. Capacitor 806 has a first terminal and a second terminal. The first terminal of capacitor 806 is coupled to the first terminal 602 of the capacitor bank 601. The second terminal of capacitor 806 is coupled to node 820.

Capacitor 808 has a first terminal and a second terminal. The first terminal of capacitor 808 is coupled to node 820. The second terminal of capacitor 808 is coupled to a (second) node 822. Capacitor 810 has a first terminal and a second terminal. The first terminal of capacitor 810 is coupled to node 820. The second terminal of capacitor 810 is coupled to node 822. Capacitor 812 has a first terminal and a second terminal. The first terminal of capacitor 812 is coupled to node 820. The second terminal of capacitor 812 is coupled to node 822.

Capacitor 814 has a first terminal and a second terminal. The first terminal of capacitor 814 is coupled to node 822. The second terminal of capacitor 814 is coupled to the second terminal 614 of the capacitor bank 601. Capacitor 816 has a first terminal and a second terminal. The first terminal of capacitor 816 is coupled to node 822. The second terminal of capacitor 816 is coupled to the second terminal 614 of the capacitor bank 601. Capacitor 818 has a first terminal and a second terminal. The first terminal of capacitor 818 is coupled to node 822. The second terminal of capacitor 818 is coupled to the second terminal 614 of capacitor bank 601.

Capacitor bank 601 of FIG. 8 shows an alternative example of how capacitors can be arranged within the capacitor banks 504a, 504b. The capacitor arrangement of circuit 800 is more complex relative to circuits 600, 700a, 700b. For example, the number of capacitors of circuit 800 may occupy more space on a chip relative to circuit 600 or circuit 700a. However, circuit 600 or other configurations of the capacitor bank 601 can be generate a non-linear current that has an equal amplitude relative to the non-linear current of the filter 104 of FIG. 5. As such, FIG. 5 can be omit the scaling circuit 210. In this example, a capacitor value of each of capacitors 802, 804, 806, 808, 810, 812, 814, 816, 818 can be the same as the capacitor value of capacitors 502a, 502b of FIG. 5. Accordingly, the equivalent capacitance value of capacitor bank 601 of circuit 800 is the same as the capacitance value of capacitors 502a, 502b. Thus, the various configurations of capacitor bank 601 of circuits 600, 700a, 700b, 800 illustrate a non-limiting set of options for the non-linear current circuits 208a, 208b.

Figure 9:
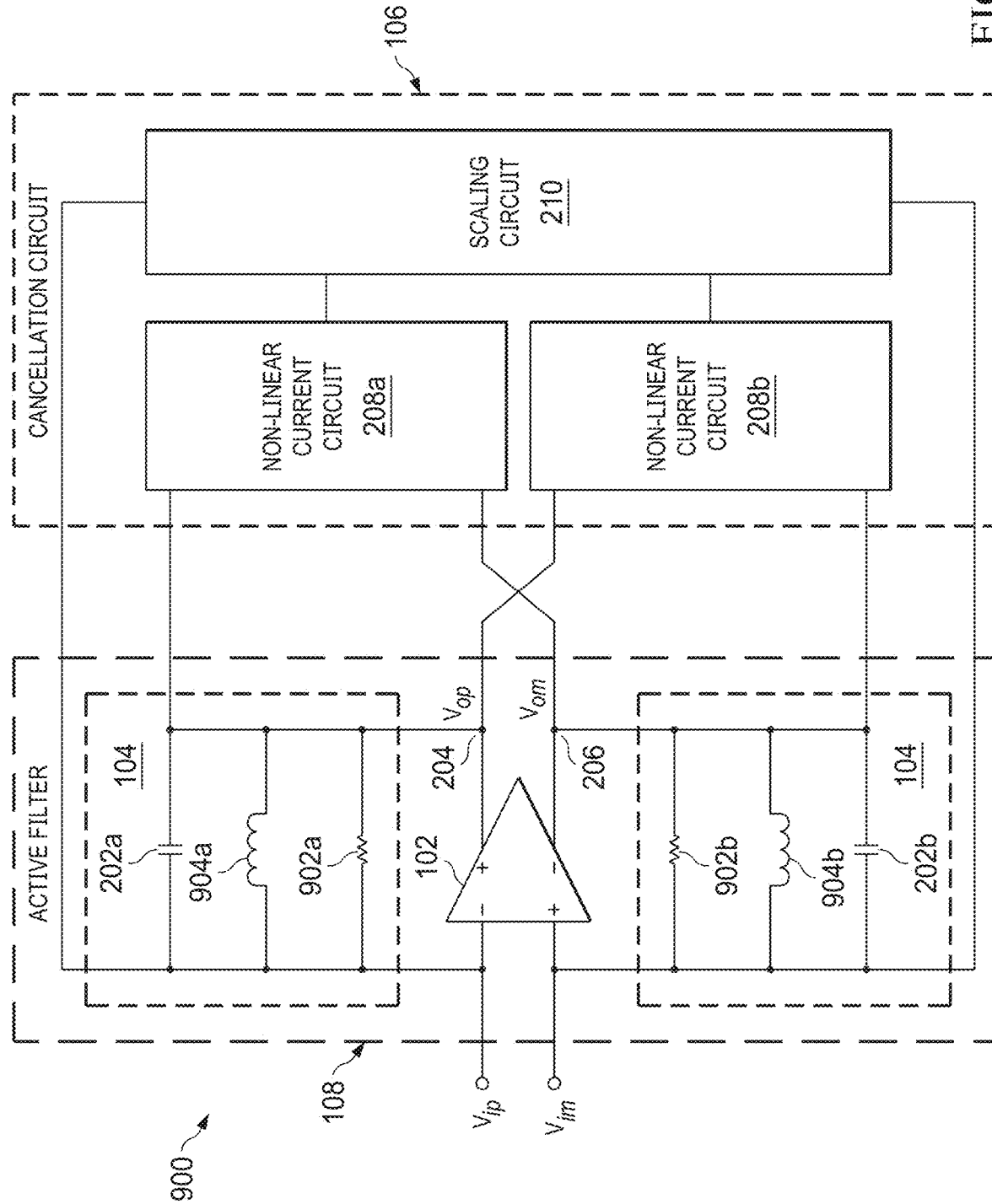
FIGS. 9, 10, 11, and 12 are example circuits that illustrate additional examples of the active filter and cancellation circuit.

FIG. 9 shows a circuit 900 with a bandpass filter. Circuit 900 shows alternative examples for the filter 104 of FIG. 4, where additional components of filter 104 are illustrated.

The filter 104 of circuit 900 shows a (first) resistor 902a, a (first) inductor 904a, a (second) resistor 902b, and a (second) inductor 904b. The resistor 902a has a first terminal and a second terminal. The first terminal of resistor 902a is coupled to the first input of amplifier 102. The second terminal of resistor 902a is coupled to the first output of amplifier 102. The inductor 904a has a first terminal and a second terminal. The first terminal of inductor 904a is coupled to the first input of amplifier 102. The second terminal of inductor 904a is coupled to the first output of amplifier 102.

The resistor 902b has a first terminal and a second terminal. The first terminal of resistor 902b is coupled to the second input of amplifier 102. The second terminal of resistor 902b is coupled to the second output of amplifier 102. The inductor 904b has a first terminal and a second terminal. The first terminal of inductor 904b is coupled to the second input of amplifier 102. The second terminal of inductor 904b is coupled to the second output of amplifier 102. Accordingly, filter 104 of circuit 900 illustrates components, in addition to those in circuit 400 of FIG. 4, that define a bandpass filter.

Figure 10:
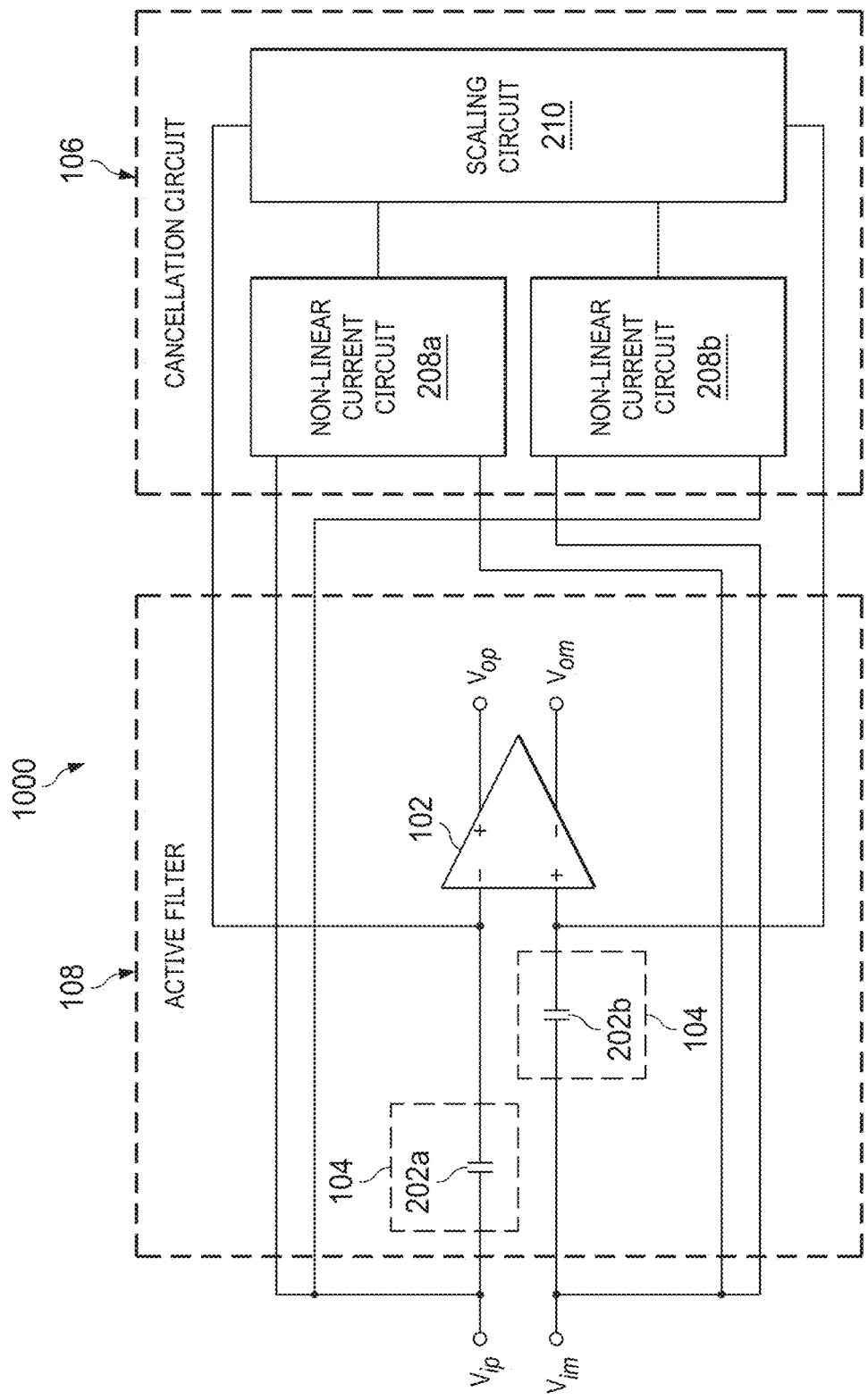

FIG. 10 shows a circuit 1000 with a highpass filter. Circuit 1000 shows alternative examples for the filter 104 relative to FIGS. 4 and 9 where the filter 104 is a highpass filter. Specifically, capacitors 202a, 202b are coupled in series with amplifier 102 between terminals $V_{ip}$ and $V_{im}$ and the first and second inputs of amplifier 102 respectively.

Circuit 1000 shows filter 104 with capacitor 202a and capacitor 202b. Capacitor 202a has a first terminal and a second terminal. The first terminal of capacitor 202a is coupled to $V_{ip}$. The second terminal of capacitor 202a is coupled to the first input of amplifier 102. Capacitor 202b has a first terminal and a second terminal. The first terminal of capacitor 202b is coupled to $V_{im}$. The second terminal of capacitor 202b is coupled to the second input of amplifier 102.

The first input of the non-linear current circuit 208a is coupled to the first terminal of capacitor 202a. The second input of the non-linear current circuit 208a is coupled to the first terminal of capacitor 202b. The first input of the non-linear current circuit 208b is coupled to the first terminal of capacitor 202b. The second input of the non-linear current circuit 208b is coupled to the first terminal of capacitor 202a. The first output of scaling circuit 210 is coupled to the first input of amplifier 102. The second output of scaling circuit 210 is coupled to the second input of amplifier 102.

Capacitor 202a injects a non-linear current into the first input of amplifier 102. Likewise, capacitor 202b injects a non-linear current into the second input of amplifier 102. The non-linear current from the scaling circuit 210 injected at the first and second inputs of amplifier 102 cancel the non-linear currents of capacitor 202a, 202b respectively.

It is noted that there are various permutations of lowpass filter, highpass filter, bandpass filter, bandstop filter, and active filter configurations. For example, the filter 104 of circuit 500 of FIG. 5 can be a lowpass filter or a bandpass filter. While not every permutation is illustrated herein, the principles described herein are applicable to configurations not shown. The principal of coupling the cancellation circuit 106 to the active filter or filter in such a manner that the cancellation circuit 106 generates a non-linear current that is equal in amplitude and opposite in phase relative to a non-linear current generated by the filter 104 applies to various filter topologies. The non-linear current of the cancellation circuit 106 is injected at a node common with the non-linear current of the filter 104 to cancel the non-linear current of the filter 104, which applies to various filter topologies.

Figure 11:
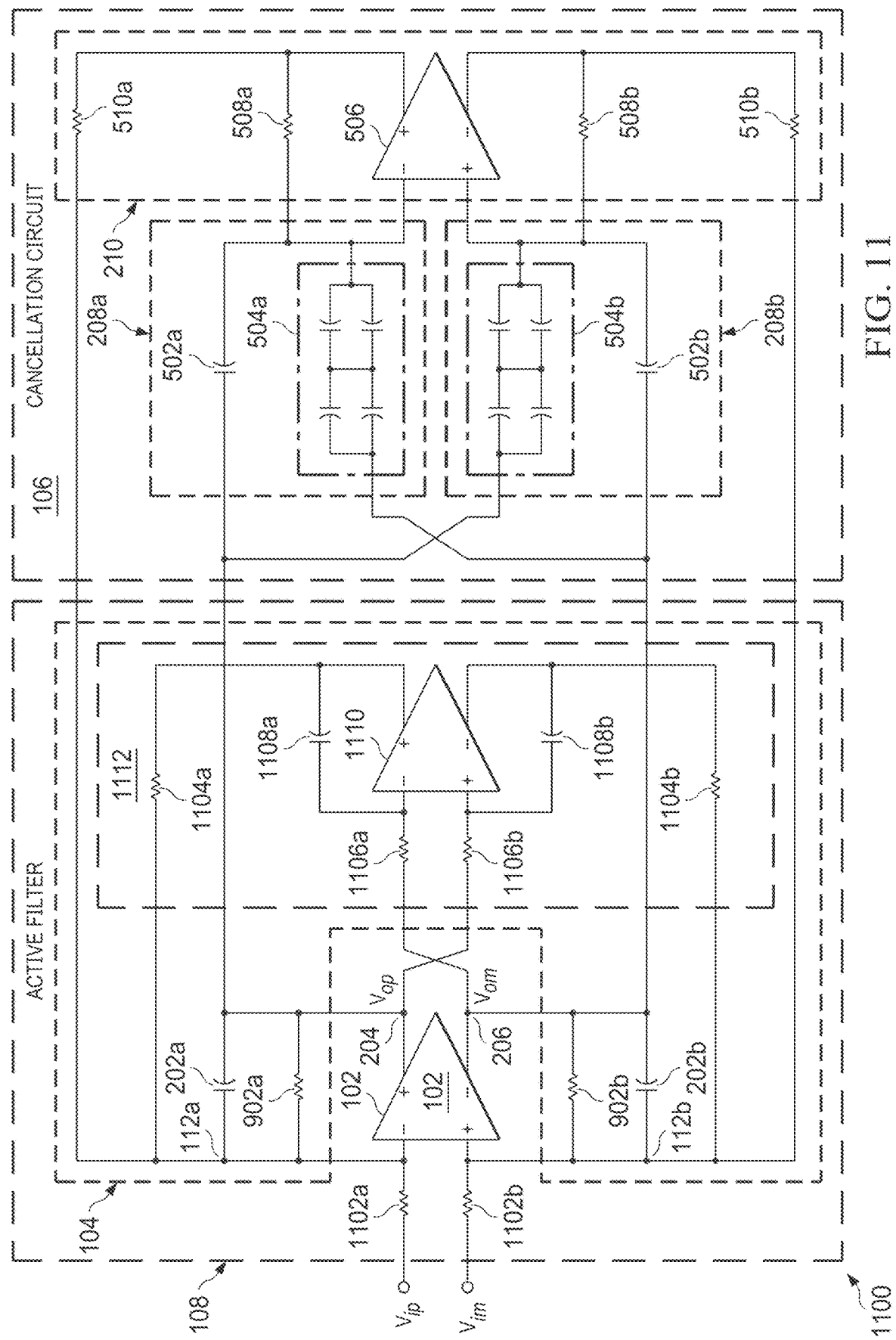

FIG. 11 shows a circuit 1100 illustrating additional features of an active filter. Circuit 1100 shows additional features relative to FIGS. 5 and 9 where the inductors 904a, 904b are replaced with a Gyrator circuit 1112. Aspects of the cancellation circuit 106 of FIG. 11 correspond to aspects of the cancellation circuit 106 of FIG. 5

Circuit 1100 shows the active filter 108 with a resistor 1102a and a resistor 1102b. Resistor 1102a has a first terminal and a second terminal. The first terminal of resistor 1102a is coupled to $V_{ip}$. The second terminal of resistor 1102a is coupled to the first input of amplifier 102. Resistor 1102b has a first terminal and a second terminal. The first terminal of resistor 1102b is coupled to $V_{im}$. The second terminal of resistor 1102b is coupled to the second input of amplifier 102.

The filter 104 includes a capacitor 1108a, a capacitor 1108b, and a (third) amplifier 1110. The amplifier has a first input that is an inverting input, a second input that is a non-inverting input, a first output that is a non-inverting output, and a second output that is an inverting output. Capacitor 1108a has a first terminal and a second terminal. The first terminal of capacitor 1108a is coupled to the first input of amplifier 1110. The second terminal of capacitor 1108a is coupled to the first output of amplifier 1110. Capacitor 1108b has a first terminal and a second terminal. The first terminal of capacitor 1108b is coupled to the second input of amplifier 1110. The second terminal of capacitor 1108b is coupled to the second output of amplifier 1110.

The filter 104 further includes a resistor 1106a and a resistor 1106b. Resistor 1106a has a first terminal and a second terminal. The first terminal of resistor 1106a is coupled to the second output of amplifier 102 at node $V_{om}$ 206. The second terminal of resistor 1106a is coupled to the first input of amplifier 1110. Resistor 1106b has a first terminal and a second terminal. The first terminal of resistor 1106b is coupled to the first output of amplifier 102 at node $V_{op}$ 204. The second terminal of resistor 1106b is coupled to the second input of amplifier 1110.

The filter 104 further includes a resistor 1104a and a resistor 1104b. Resistor 1104a has a first terminal and a second terminal. The first terminal of resistor 1104a is coupled to the first input of amplifier 102 through node 112a. The second terminal of resistor 1104a is coupled to the first output of amplifier 1110. Resistor 1104b has a first terminal and a second terminal. The first terminal of resistor 1104b is coupled to the second input of amplifier 102a through node 112b. The second terminal of resistor 1104b is coupled to the second output of amplifier 1110.

Resistors 1104a, 1106a, 1106b, 1104b, capacitors 1108a, 1108b, and amplifier 1110 define the Gyrator circuit 1112 that replaces the inductors 904a, 904b of FIG. 9. The components of Gyrator circuit 1112 can provide desired filtering characteristics (e.g., bandpass frequencies) for filter 104. As the filter 104 of circuit 1100 has capacitors 1108a, 1108b from the Gyrator circuit 1112, non-linearities of capacitors 1108a, 1108b are generated within the active filter 108. In some examples, a capacitor value of capacitors 1108a, 1108b are the same as a capacitor value of capacitors 202a, 202b. As such, the principles described previously in FIGS. 5-8 regarding capacitor values of the cancellation circuit apply also to circuit 1100. Accordingly, the cancellation circuit 106 of circuit 1100 can generate a non-linear current that cancels the non-linear current generated by filter 104 of circuit 1100. Also, it is noted that while the non-linear current circuits 208a, 208b are illustrated with capacitor bank of FIG. 6, capacitor banks 504a, 504b of non-linear current circuits 208a, 208b can be replaced with circuits 700a, 700b, or 800 of FIG. 7A, 7B, or 8 respectively, or other suitable circuits as described herein.

Figure 12:
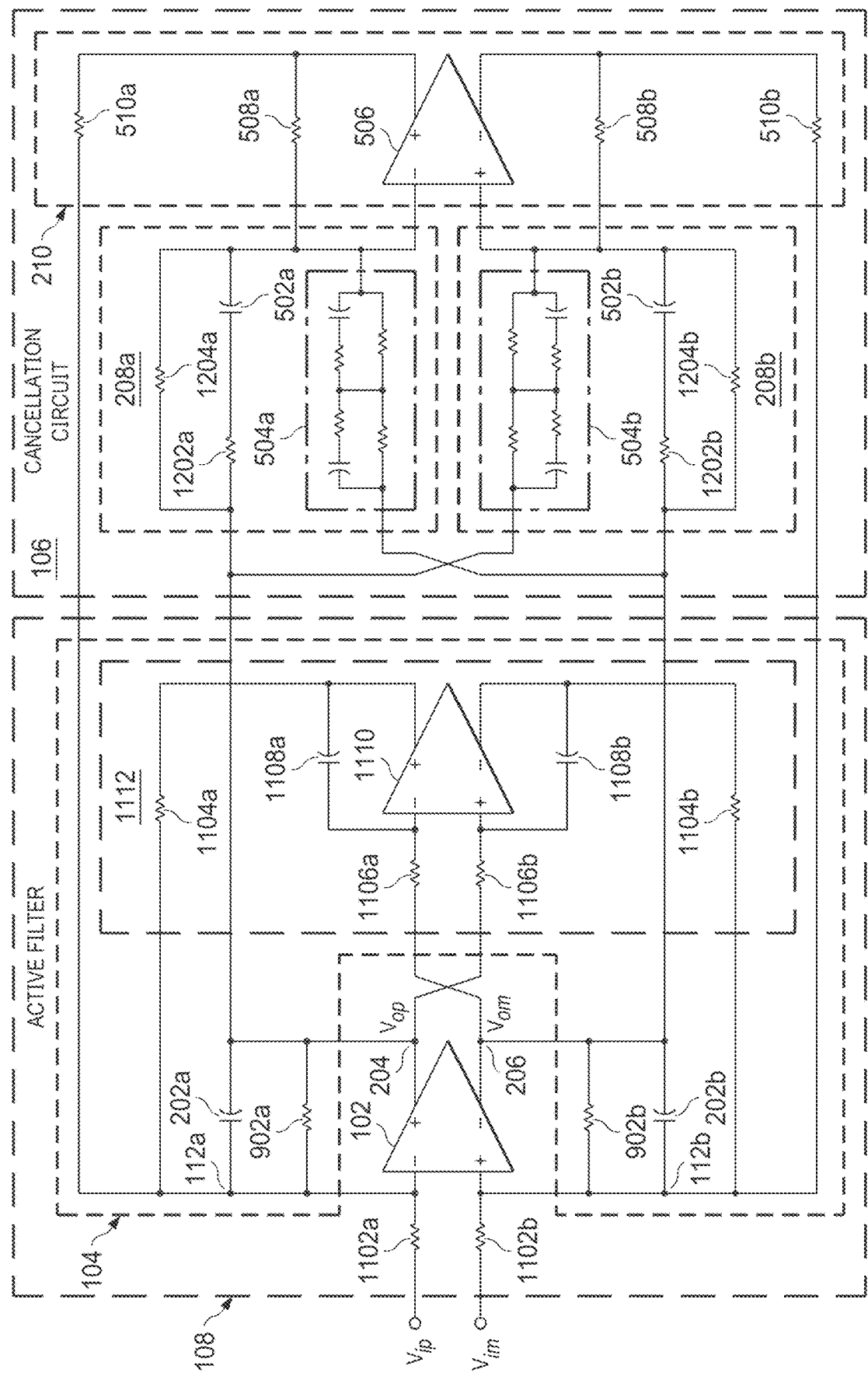

FIG. 12 shows a circuit 1200 illustrating additional features of the cancellation circuit 106. Circuit 1200 shows additional or alternative features relative to FIG. 11 where the non-linear current circuits 208a, 208b have additional resistors. Aspects of the active filter 108 of circuit 1200 correspond to aspects of the active filter 108 of circuit 1100 of FIG. 11.

Circuit 1200 shows the non-linear current circuit 208a with a resistor 1202a and resistor 1204a. Resistor 1202a has a first terminal and a second terminal. The first terminal of resistor 1202a is coupled to the first output of amplifier 102 at node $V_{op}$ 204. The second terminal of resistor 1202a is coupled to the first terminal of capacitor 502a. Resistor 1204a has a first terminal and a second terminal. The first terminal of resistor 1204a is coupled to the first terminal of resistor 1202a. The second terminal of resistor 1204a is coupled to the second terminal of capacitor 502a.

The non-linear current circuit 208b shows resistor 1202b and resistor 1204b. Resistor 1202b has a first terminal and a second terminal. The first terminal of resistor 1202b is coupled to the second output of amplifier 102 at node $V_{om}$ 206. The second terminal of resistor 1202b is coupled to the first terminal of capacitor 502b. Resistor 1204b has a first terminal and a second terminal. The first terminal of resistor 1204b is coupled to the first terminal of resistor 1202b. The second terminal of resistor 1204b is coupled to the second terminal of capacitor 502b.

The capacitor banks 504a, 504b are illustrated with circuit 700b of FIG. 7B. However, it is noted that capacitor banks 504a, 504b can be replaced with circuit 600, 700a, or 800 of FIG. 6, 7, or 8 respectively, or another suitable circuit. In some examples, resistors 1202a, 1202b can provide stability to the active filter 108 by loading the output of amplifier 102. In some examples, resistors 1204a, 1204b generate a linear current at the second terminal of capacitors 502a, 502b to cancel linear current from other resistors in the circuit, for example, resistors 1204a, 1204b of FIG. 7A or FIG. 7B.

Figure 13:
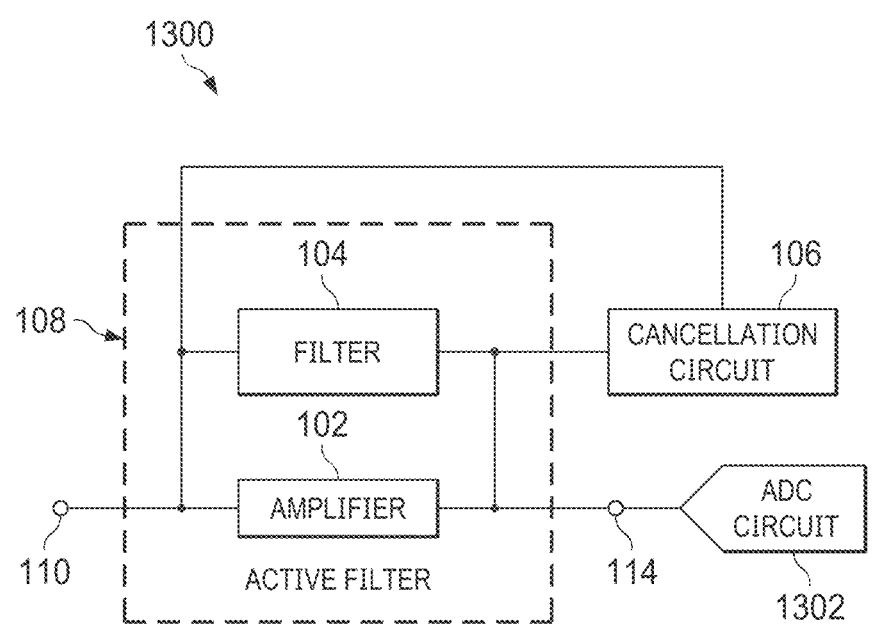
FIG. 13 is an example circuit that illustrates the active filter and cancellation circuit coupled to an analog to digital converter circuit.

FIG. 13 shows a circuit 1300 that includes an active filter with a cancellation circuit and an analog to digital converter (ADC) circuit.

Circuit 1300 shows an active filter 108 with a filter 104 and amplifier 102 that are coupled to a cancellation circuit 106. An output 114 of the active filter 108 is coupled to an ADC circuit. Aspects of the active filter 108 and cancellation circuit 106 are analogous to the description provided in FIG. 1 and subsequent alternative examples herein.

Aspects described herein relate to an active filter 108 coupled to a cancellation circuit 106 where the cancellation circuit 106 cancels distortion generated by a filter 104 of the active filter 108. In some examples the active filter 108 and cancellation circuit 106 can be fabricated as an integrated circuit (IC) on chip. As such, the active filter 108 and cancellation circuit 106 can be a standalone device on a standalone chip. Alternatively, the active filter 108 and cancellation circuit 106 can be integrated with the ADC circuit 1302 as illustrated in circuit 1300. As such, the active filter 108 and cancellation circuit 106 can be arranged before or within the ADC circuit 1302 depending on the application. Accordingly, the active filter 108 and cancellation circuit 106 can be implemented as standalone devices or integrated with other devices, such as ADC circuit 1302.

The above description of illustrated examples, implementations, aspects, etc., of the subject description, including what is described in the Abstract, is not to be exhaustive or to limit the described aspects to the precise forms described. While specific examples, implementations, aspects, etc., are described herein for illustrative purposes, various modifications are possible that are considered within the scope of such examples, implementations, aspects, etc., as those skilled in the relevant art can recognize.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Unless otherwise stated, "about," "approximately," or "substantially" preceding a value means +/−10 percent of the stated value, or, if the value is zero, a reasonable range of values around zero. Modifications are possible in the described examples, and other implementations are possible, within the scope of the claims.

What is claimed is:

1. A circuit, comprising:
an active filter, including an input, a first output, and a second output;
a first capacitor having a first terminal and a second terminal, wherein the first terminal of the first capacitor is coupled to the first output of the active filter, the second terminal of the first capacitor is coupled to the input of the active filter, and wherein the first capacitor has a capacitance value; and
a capacitor bank having a first terminal and a second terminal, wherein the first terminal of the capacitor bank is coupled to the second output of the active filter, wherein the second terminal of the capacitor bank is coupled to the second terminal of the first capacitor and coupled to the input of the active filter, wherein the capacitor bank has a capacitance that is equivalent to the capacitance value of the first capacitor to configure the capacitor bank to provide a first current that is proportional in amplitude to and opposite in phase from a current of the first capacitor.

2. The circuit of claim 1, wherein the circuit further comprises:
an amplifier having an input and an output, wherein the input of the amplifier is coupled to the second terminal of the first capacitor and the second terminal of the capacitor bank, and wherein the output of the amplifier is coupled to the input of the active filter.

3. The circuit of claim 1, wherein the capacitor bank further includes:
a second capacitor having a first terminal and a second terminal, wherein the first terminal of the second capacitor is coupled to the first terminal of the capacitor bank; and
a third capacitor having a first terminal and a second terminal, wherein the first terminal of the third capacitor is coupled to the second terminal of the second capacitor, and wherein the second terminal of the third capacitor is coupled to the second terminal of the capacitor bank.

4. The circuit of claim 3, wherein the capacitor bank further includes:
a fourth capacitor having a first terminal and a second terminal, wherein the first terminal of the fourth capacitor is coupled to the first terminal of the capacitor bank, and wherein the second terminal of the fourth capacitor is coupled to the second terminal of the second capacitor and the first terminal of the third capacitor; and
a fifth capacitor having a first terminal and a second terminal, wherein the first terminal of the fifth capacitor is coupled to the second terminal of the fourth capacitor, the second terminal of the second capacitor, and the first terminal of the third capacitor, and wherein the second terminal of the fifth capacitor is coupled to the second terminal of the capacitor bank.

5. The circuit of claim 3, wherein the capacitor bank further includes:
a first resistor having a first terminal and a second terminal, wherein the first terminal of the first resistor is coupled to the first terminal of the capacitor bank, and the second terminal of the first resistor is coupled to the first terminal of the second capacitor and the second terminal of the third capacitor; and
a second resistor having a first terminal and a second terminal, wherein the first terminal of the second resistor is coupled to the second terminal of the first resistor, the second terminal of the second capacitor, and the first terminal of the third capacitor, and wherein the second terminal of the second resistor is coupled to the second terminal of the capacitor bank.

6. The circuit of claim 5, wherein the capacitor bank further includes:
a third resistor having a first terminal and a second terminal, wherein the first terminal of the third resistor is coupled to the second terminal of the second capacitor, and the second terminal of the third resistor is coupled to the second terminal of the first resistor and the first terminal of the second resistor; and
a fourth resistor having a first terminal and a second terminal, wherein the first terminal of the fourth resistor is coupled to the second terminal of the third resistor, the second terminal of the first resistor, and the first terminal of the second resistor, and wherein the second terminal of the fourth resistor is coupled to the first terminal of the third capacitor.

7. A circuit, comprising:
a first amplifier having a first input, a first output, and a second output;
a first capacitor having a first terminal and a second terminal, the first terminal of the first capacitor is coupled to the first input of the first amplifier and the second terminal of the first capacitor is coupled to the first output of the first amplifier;
a capacitor bank having a first terminal and a second terminal, wherein the first terminal of the capacitor bank is coupled to the second output of the first amplifier;
a first resistor having first and second terminals, wherein the first terminal of the first resistor is coupled to the second terminal of the capacitor bank, and the second terminal of the first resistor is coupled to the first input of the first amplifier and the first terminal of the first capacitor; and a second capacitor having a first terminal and a second terminal, wherein the first terminal of the second capacitor is coupled to the first output of the first amplifier and the second terminal of the first capacitor, and the second terminal of the second capacitor is coupled to the second terminal of the capacitor bank and the first terminal of the first resistor.

8. The circuit of claim 7, further comprising:
a second amplifier having a first input and a first output, wherein the first input of the second amplifier is coupled to the second terminal of the capacitor bank, the first terminal of the first resistor, and the second terminal of the second capacitor, and the first output of the second amplifier is coupled to the second terminal of the first resistor, the first input of the first amplifier, and the first terminal of the first capacitor.

9. The circuit of claim 8, further comprising:
a second resistor having a first terminal and a second terminal, wherein the first terminal of the second resistor is coupled to the first input of the first amplifier and the first terminal of the first capacitor, and wherein the second terminal of the second resistor is coupled to the first output of the second amplifier and the second terminal of the first resistor.

10. The circuit of claim 7, further comprising:
a second resistor coupling the second terminal of the first resistor the first input of the first amplifier and the first terminal of the first capacitor.

11. The circuit of claim 7, wherein the capacitor bank includes a plurality of capacitors and wherein a capacitance value of each of the plurality of capacitors is the same as a capacitance value of the second capacitor.

12. The circuit of claim 7, further comprising a filter, wherein the filter includes the first capacitor and the filter is a bandpass or a lowpass filter.

13. An integrated circuit, comprising:
a first amplifier having a first input, a second input, a first output, and a second output;
a first capacitor having a first terminal and a second terminal, wherein the first terminal of the first capacitor is coupled to the first input of the first amplifier and the second terminal of the first capacitor is coupled to the first output of the first amplifier;
a second capacitor having a first terminal and a second terminal, wherein the first terminal of the second capacitor is coupled to the second input of the first amplifier, and the second terminal of the second capacitor is coupled to the second output of the first amplifier;
a first capacitor bank having a first terminal and a second terminal, wherein the first terminal of the first capacitor bank is coupled to the second output of the first amplifier and the second terminal of the first capacitor bank is coupled to the first terminal of the first capacitor;
a second capacitor bank having a first terminal and a second terminal, wherein the first terminal of the second capacitor bank is coupled to the first output of the first amplifier and the second terminal of the second capacitor bank is coupled to the first terminal of the second capacitor;
a third capacitor having a first terminal and a second terminal, wherein the first terminal of the third capacitor is coupled to the first output of the first amplifier, and wherein the second terminal of the third capacitor is coupled to the second terminal of the first capacitor bank and the first terminal of the first capacitor;
a fourth capacitor having a first terminal and a second terminal, wherein the first terminal of the fourth capacitor is coupled to the second output of the first amplifier, and wherein the second terminal of the fourth capacitor is coupled to the second terminal of the second capacitor bank and the first terminal of the second capacitor; and
a second amplifier having a first input, a second input, a first output, and a second output, wherein the first input of the second amplifier is coupled to the second terminal of the first capacitor bank and the second terminal of the third capacitor, the second input of the second amplifier is coupled to the second terminal of the second capacitor bank and the second terminal of the fourth capacitor, the first output of the second amplifier is coupled to the first terminal of the first capacitor, and the second output of the second amplifier is coupled to the second terminal of the second capacitor.

14. The integrated circuit of claim 13, wherein the first capacitor has a capacitance value (C), the second capacitor has a capacitance that is C, the third capacitor has a capacitance value that is C multiplied by a scalar b (bC), the fourth capacitor has a capacitance value that is bC, and the first capacitor bank and the second capacitor bank each have an equivalent capacitance that is bC.

15. The integrated circuit of claim 13, wherein the first capacitor bank and the second capacitor bank each have two or more capacitors, and wherein an equivalent capacitance of the first capacitor bank and the second capacitor bank is the same as a capacitance value of the third capacitor and the fourth capacitor.

16. The integrated circuit of claim 13, further comprising:
a first resistor having a first terminal and a second terminal, wherein the first terminal of the first resistor is coupled to the second terminal of the third capacitor and the second terminal of the first capacitor bank, and wherein the second terminal of the first resistor is coupled to the first output of the second amplifier; and
a second resistor having a first terminal and a second terminal, wherein the first terminal of the second resistor is coupled to the second terminal of the fourth capacitor and the second terminal of the second capacitor bank, and wherein the second terminal of the second resistor is coupled to the second output of the second amplifier.

17. The integrated circuit of claim 16, further comprising:
a third resistor having a first terminal and a second terminal, wherein the first terminal of the third resistor is coupled to the first terminal of the first capacitor, and the second terminal of the third resistor is coupled to the first output of the second amplifier; and
a fourth resistor having a first terminal and a second terminal, wherein the first terminal of the fourth resistor is coupled to the first terminal of the second capacitor and the second terminal of the fourth resistor is coupled to the second output of the second amplifier.

18. The integrated circuit of claim 17, further comprising:
a fifth resistor having a first terminal and a second terminal, wherein the first terminal of the fifth resistor is coupled to the first terminal of the third capacitor and the second terminal of the fifth resistor is coupled to the second terminal of the third capacitor; and
a sixth resistor having a first terminal and a second terminal, wherein the first terminal of the sixth resistor is coupled to the first terminal of the fourth capacitor and the second terminal of the sixth resistor is coupled to the second terminal of the fourth capacitor.

* * * * *